United States Patent
Jin

(10) Patent No.: US 11,476,324 B2
(45) Date of Patent: Oct. 18, 2022

(54) MIM CAPACITOR AND MANUFACTURING METHOD THEREFOR

(71) Applicant: CSMC TECHNOLOGIES FAB2 CO., LTD., Wuxi (CN)

(72) Inventor: Hongfeng Jin, Wuxi (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 17/263,285

(22) PCT Filed: Nov. 11, 2019

(86) PCT No.: PCT/CN2019/116996
§ 371 (c)(1),
(2) Date: Jan. 26, 2021

(87) PCT Pub. No.: WO2020/098581
PCT Pub. Date: May 22, 2020

(65) Prior Publication Data
US 2021/0296428 A1    Sep. 23, 2021

(30) Foreign Application Priority Data

Nov. 16, 2018   (CN) .......................... 201811364078.6

(51) Int. Cl.
*H01L 49/02*      (2006.01)
*H01L 23/522*     (2006.01)
*H01L 21/311*     (2006.01)

(52) U.S. Cl.
CPC .......... *H01L 28/60* (2013.01); *H01L 23/5223* (2013.01); *H01L 21/31111* (2013.01); *H01L 28/75* (2013.01)

(58) Field of Classification Search
CPC ..... H01L 28/60; H01L 23/5223; H01L 21/02; H01L 23/64; H01L 29/92; H01L 28/88; H01L 28/40; H01L 28/75; H01L 21/31111
See application file for complete search history.

(56) References Cited

U.S. PATENT DOCUMENTS

2017/0207298 A1    11/2017   Chang et al.
2017/0330931 A1*   11/2017   Cheng ................. H01L 23/5223

FOREIGN PATENT DOCUMENTS

CN            1402325         3/2003
CN            1449041         10/2003
(Continued)

OTHER PUBLICATIONS

Semiconductor MFG Int (CN101789429A, examiner uses machine translation, hereinafter Semiconductor MFG Int) (Year: 2010).*

(Continued)

*Primary Examiner* — Patricia D Valenzuela
(74) *Attorney, Agent, or Firm* — Dority & Manning, P.A.

(57) ABSTRACT

An MIM capacitor and a manufacturing method therefor. The manufacturing method comprises: providing a semiconductor substrate, and forming a first metal layer on the semiconductor substrate; forming an anti-reflection layer on the first metal layer; performing photoetching and etching on the first metal layer and the anti-reflection layer so as to define an MIM capacitor region, wherein the first metal layer in the MIM capacitor region serves as a lower electrode plate of the MIM capacitor, and the anti-reflection layer in the MIM capacitor region serves as a dielectric layer of the MIM capacitor; and forming an upper electrode plate of the MIM capacitor on the anti-reflection layer in the MIM capacitor region.

15 Claims, 2 Drawing Sheets

(56) References Cited

FOREIGN PATENT DOCUMENTS

| | | |
|---|---|---|
| CN | 101789429 | 7/2010 |
| CN | 102339869 | 2/2012 |
| CN | 106876371 | 6/2017 |
| KR | 20000020310 | 4/2000 |
| KR | 20020045470 | 6/2002 |

OTHER PUBLICATIONS

Chinese First Office Action for corresponding CN Application No. 201811364078.6, 7 pages.
International Search Report for PCT/CN2019/116996, dated Jan. 23, 2020, 4 pages.

* cited by examiner

MIM CAPACITOR AND MANUFACTURING METHOD THEREFOR

CROSS REFERENCES TO RELATED APPLICATION

This patent application claims priority to Chinese patent application No. 201811364078.6, filed on Nov. 16, 2018, entitled "MIM CAPACITOR AND MANUFACTURING METHOD THEREFOR" the disclosure of which is hereby incorporated by reference in its entirety.

TECHNICAL FIELD

The present disclosure relates to the field of semiconductor technology, and particularly relates to an MIM capacitor and a manufacturing method therefor.

BACKGROUND

Capacitors as devices for charge storage, coupling, and filtering, are widely used in semiconductor integrated circuits. Among the existing integrated circuit capacitors, Metal-Isolation-Metal (MIM) capacitor has gradually become the mainstream in the radio frequency integrated circuits, especially has being widely used in the application of mixing/RF CMOS processes. The reason is that it is usually made in the metal interconnection layer, which is compatible with integrated circuit technology and has a long distance from the substrate. It can overcome disadvantages of many other types of capacitors, such as large parasitic capacitance, and significant declined device performance with increasing frequency.

The MIM capacitor is usually located in an upper layer of a multilayer device structure in the integrated circuits, and its structure is closer to a typical capacitor, that is, a capacitor with a dielectric between metal electrode plates. As shown in FIG. 1, the semiconductor device includes an MIM capacitor region and an other circuit region. The MIM capacitor structure includes a lower electrode plate 101, an upper electrode plate 103, and a dielectric layer 102 between the lower electrode plate 101 and the upper electrode plate 103. The structure can realize the charge storage function. The dielectric layer 102 is usually formed of a silicon nitride (SiN) film with a high dielectric constant. In addition, the lower electrode plate 101 and the upper electrode plate 103 of the MIM capacitor are respectively connected to the top metal layer 104 through the contact holes 105 formed in the Inter Metal Dielectric (IMD) layer 100.

In the subsequent manufacturing process of the semiconductor device, in order to connect various components to form an integrated circuit, a metal material with a relatively high conductivity (such as copper) is usually used for wiring, that is, metal wiring. In an exemplary solution, the metal wiring process and the production of the MIM capacitor are two independent process steps, and the MIM capacitor region needs to be defined by a photolithographing process dedicated to the production of the MIM capacitor to form the MIM capacitor.

SUMMARY

In the section of the summary, a series of simplified concepts are introduced, which will be described in further detail in the section of the detailed description of the embodiments. The section of the summary of the present disclosure does not mean an attempt to limit the key features and necessary technical features of the claimed technical solution, nor does it mean an attempt to determine the protection scope of the claimed technical solution.

The present disclosure provides a manufacturing method for an MIM capacitor, which includes the following steps:

providing a semiconductor substrate, and forming a first metal layer on the semiconductor substrate;

forming an anti-reflection layer on the first metal layer;

performing photolithographing and etching to the first metal layer and the anti-reflection layer to define an MIM capacitor region, the first metal layer in the MIM capacitor region serves as a lower electrode plate of the MIM capacitor, and the anti-reflection layer in the MIM capacitor region serves as a dielectric layer of the MIM capacitor; and forming an upper electrode plate of the MIM capacitor on the anti-reflection layer in the MIM capacitor region.

The present disclosure further provides an MIM capacitor, which includes:

a semiconductor substrate;

a first metal layer formed on the semiconductor substrate;

an anti-reflection layer formed on the first metal layer; and an upper electrode plate of the MIM capacitor formed on the anti-reflection layer in the MIM capacitor region;

the first metal layer in the MIM capacitor region serves as a lower electrode plate of the MIM capacitor, and the anti-reflection layer in the MIM capacitor region serves as a dielectric layer of the MIM capacitor. According to the manufacturing method for an MIM capacitor provided by the present disclosure, the anti-reflection layer remaining in the etched region after etching serves as the dielectric layer of the capacitor at the same time, and metal is continued to be filled into the etched region as the upper electrode plate, with no more need for manufacturing the additional dielectric layer of the capacitor, and no more need for additional photolithographing process to define the region of the upper electrode plate, which reduces the number of photolithographing and etching, thereby reducing the process cost and shortening the process cycle.

BRIEF DESCRIPTION OF THE DRAWINGS

By describing the embodiments of the present disclosure in more detail with reference to the accompanying drawings, the above and other purposes, features and advantages of the present disclosure will become more apparent. The accompanying drawings are used to provide a further understanding of the embodiments of the present disclosure, and constitute a part of the specification, and which, together with the embodiments of the present disclosure, are used to explain the present disclosure and do not constitute any limitation to the present disclosure. In the accompany drawings, the same reference numerals generally represent the same components or steps.

In the accompany drawings.

DETAILED DESCRIPTION

Figure 1:
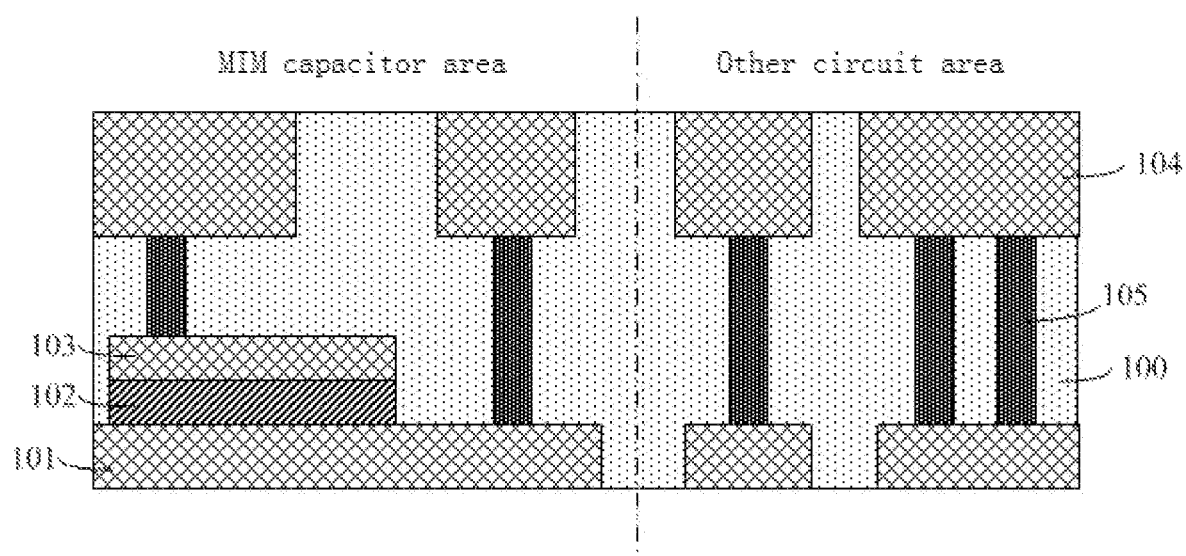
FIG. 1 is a cross-sectional view of an exemplary MIM capacitor.

In the above exemplary solution, the number of the process steps is large, which leads to an increased production cost and a prolonged production cycle. Therefore, it is necessary to propose a new manufacturing method for an MIM capacitor to solve at least one of the above problems.

In the description hereafter, numerous specific details are set forth in order to provide a more thorough understanding of the present disclosure. However, it will be apparent to those skilled in the art that the present disclosure may be implemented without one or more of these details. In other examples, in order to avoid confusion with the present disclosure, some technical features known in the art are not described.

It should be understood that the present disclosure can be embodied in different forms and should not be construed as limited to the embodiments set forth herein. Rather, providing these embodiments will make the disclosure thorough and complete, and fully convey the scope of the present disclosure to those skilled in the art. In the accompanying drawings, the sizes and relative sizes of layers and regions may be exaggerated for clarity. The same reference numerals denote the same elements from beginning to end.

It should be understood that, when an element or layer is described as being "on", "adjacent to", "connected to" or "coupled to" another element or layer, it can be directly on, adjacent to, connected to, or coupled to the other element or layer, or there can be an intermediate element. In contrast, when an element is described as being "directly on", "directly adjacent to", "directly connected to", or "directly coupled to" another element or layer, there are no intermediate element or layer. It should be understood that, although the terms of "first", "second", "third", and so on can be used to describe various elements, components, regions, layers and/or portions, these elements, components, regions, layers and/or portions should not be limited by these terms. These terms are merely used to distinguish an element, component, region, layer or portion from another element, component, region, layer or portion. Thus, the first element, component, region, layer or portion discussed below can be described as a second element, component, region, layer or portion without departing from the teachings of the present disclosure.

Spatial relation terms such as "below", "beneath", "under", "above", "on", etc., can be used herein for convenience of description to describe the relationship between an element or feature and another element or feature shown in the figures. It should be understood that, in addition to the orientations shown in the figures, the spatial relationship terms are intended to include different orientations of the devices in use and operation. For example, if a device in the figures is turned over, then the element or feature described as "below" or "beneath" another element or feature would then be oriented as "above" the other element or feature. Thus, the exemplary terms "below" and "beneath" can include both orientations of above and below. The device may be otherwise oriented (rotated 90 degrees or otherwise) and the spatial descriptions used herein are interpreted accordingly.

Terms used herein are for the purpose of describing specific embodiments only and are not intended to be limiting of the present disclosure. As used herein, "a", "one" and "said/the" in singular forms are also intended to include a plural form unless the context clearly indicates other forms. It should also be understood that the terms "consist" and/or "include" when used in the description, determine presence of the features, integers, steps, operations, elements and/or components, but do not exclude the presence or addition of one or more other features, integers, steps, operations, elements, components, and/or groups. As used herein, the terms "and/or" include any and all combinations of related listed items.

In order to thoroughly understand the present disclosure, detailed steps, and detailed structures will be set forth in the following description, so as to explain the technical solutions proposed by the present disclosure. Preferred embodiments of the present disclosure are described in detail below, however in addition to these detailed description, the present disclosure may have other embodiments.

Figure 2:
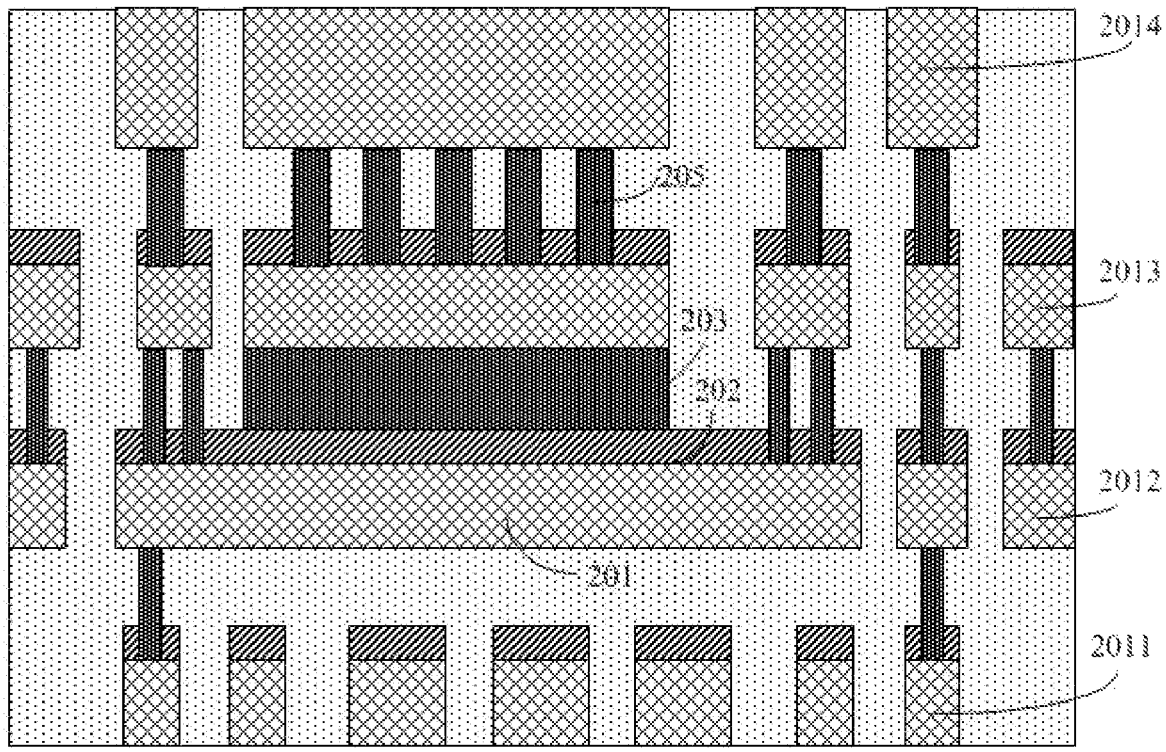
FIG. 2 is a schematic cross-sectional view of an MIM capacitor obtained by a method according to an exemplary embodiment of the present disclosure.
Figure 3:
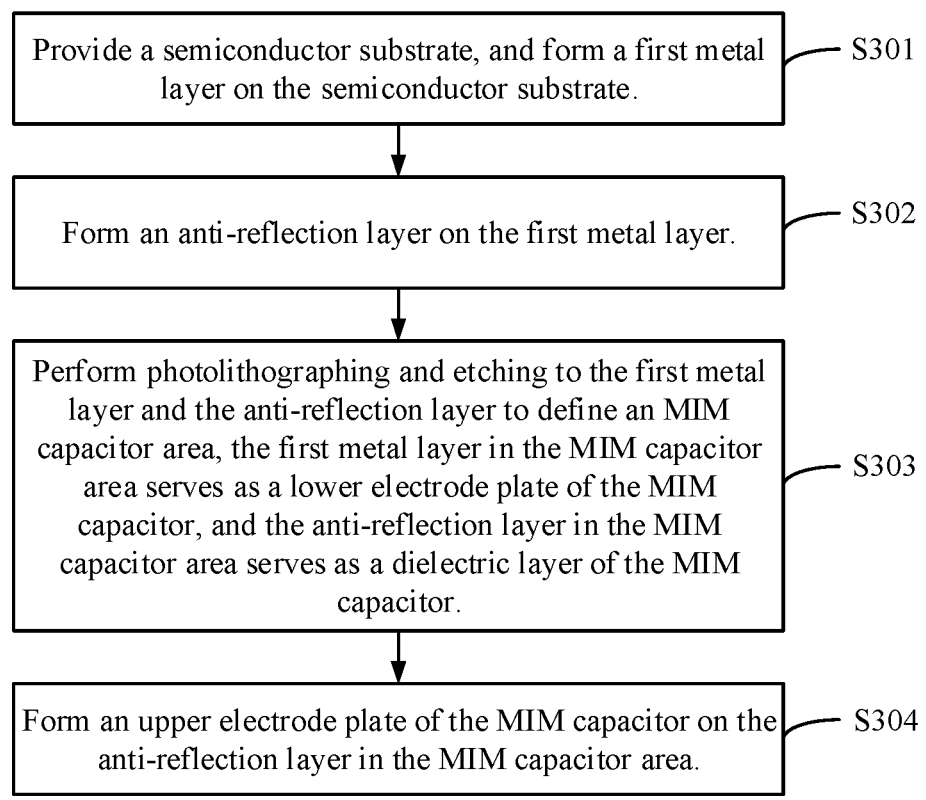
FIG. 3 is a schematic flowchart of a manufacturing method for an MIM capacitor according to an exemplary embodiment of the present disclosure.

Referring to FIG. 2 and FIG. 3, FIG. 2 is a schematic cross-sectional view of an MIM capacitor obtained by a method according to an exemplary embodiment of the present disclosure, and FIG. 3 is a schematic flowchart of a manufacturing method for an MIM capacitor according to an exemplary embodiment of the present disclosure.

The present disclosure provides a manufacturing method for an MIM capacitor. As shown in FIG. 3, the main steps of the manufacturing method include:

Step S301: provide a semiconductor substrate, and form a first metal layer on the semiconductor substrate.

Step S302: form an anti-reflection layer on the first metal layer.

Step S303: perform photolithographing and etching to the first metal layer and the anti-reflection layer to define an MIM capacitor region, the first metal layer in the MIM capacitor region serves as a lower electrode plate of the MIM capacitor, and the anti-reflection layer in the MIM capacitor region serves as a dielectric layer of the MIM capacitor.

Step S304: form an upper electrode plate of the MIM capacitor on the anti-reflection layer in the MINI capacitor region.

Hereinafter, specific implementations of the manufacturing method for a semiconductor device of the present disclosure will be described in detail.

First, step S301 is performed. As shown in FIG. 2, a semiconductor substrate is provided, and a metal layer is formed on the semiconductor substrate.

Exemplarily, the semiconductor substrate may be at least one of the following mentioned materials: single crystal silicon, silicon on insulator (SOI), stacked silicon on insulator (SSOI), stacked silicon germanium on insulator (S—SiGeOI), silicon germanium on insulator (SiGeOI), germanium on insulator (GeOI), and the like. An isolation structure (not shown in FIG. 2) is further formed in the semiconductor substrate. The isolation structure is a shallow trench isolation (STI) structure or a local oxidation of silicon (LOCOS) isolation structure. The isolation structure divides the substrate into different active regions, various semiconductor devices, such as NMOS and PMOS and the like, can be formed in the active regions.

Exemplarily, the metal wiring includes forming a plurality of metal layers and interconnect structures on the semiconductor substrate. As technology advances, the number of metal layers formed in the metal wiring process of the semiconductor device is gradually increased. In this embodiment, only the formation of four metal layers and interconnection structures are introduced, including a bottom metal layer 2011, a first metal layer 2012, a second metal layer 2013, and a top metal layer 2014 that are sequentially formed from bottom to top.

First, referring to FIG. 2, the bottom metal layer 2011 is formed according to a conventional metal wiring process. The forming method of the bottom metal layer 2011 may be one of a chemical vapor deposition (CVD) method, a physical vapor deposition (PVD) method, an atomic layer deposition (ALD) method, a low pressure chemical vapor deposition (LPCVD) method, a laser ablation deposition (LAD) method, and a selective epitaxial growth (SEG) method. In the present disclosure, the physical vapor deposition (PVD) method is preferred, and the material of the bottom metal layer 2011 includes but is not limited to copper (Cu) or aluminum (Al).

Next, a bottom anti-reflection layer is formed on the bottom metal layer 2011. The depositing method of the bottom anti-reflection layer may be one of a chemical vapor deposition (CVD) method, a physical vapor deposition (PVD) method, an atomic layer deposition (ALD) method, a low pressure chemical vapor deposition (LPCVD) method, a laser ablation deposition (LAD) method, and a selective epitaxial growth (SEG) method. In the present disclosure, the chemical vapor deposition (CVD) method is preferred, and the material of the bottom anti-reflection layer includes but is not limited to silicon oxynitride (SION).

Next, a photoresist layer (not shown in FIG. 2) defining a circuit pattern of the bottom metal layer 2011 is formed on the bottom anti-reflection layer by using a photolithographing process. The photoresist layer with the circuit pattern of the bottom metal layer 2011 may be formed by: forming a photoresist through a spin coating process, and then performing processes, such as exposure, development, and cleaning, to the photoresist. Then, the bottom metal layer 2011 and the bottom anti-reflection layer are etched with the photoresist layer serving as a mask, to form the circuit pattern of the bottom metal layer 2011. The bottom metal layer 2011 and the bottom anti-reflection layer may be dry etched. The dry etching includes, but is not limited to: reactive ion etching (RIE), ion beam etching, and plasma etching.

Next, a bottom intermetal dielectric layer is deposited. The bottom intermetal dielectric layer fills the gaps in the bottom metal layer 2011 and covers the bottom metal layer 2011 and the bottom anti-reflection layer. The depositing method of the bottom intermetal dielectric layer may be a chemical vapor deposition (CVD) method, a physical vapor deposition (PVD) method, an atomic layer deposition (ALD) method, or the like. In the present disclosure, the chemical vapor deposition (CVD) method is preferred, and the material of the bottom intermetal dielectric layer includes but is not limited to silicon dioxide ($SiO_2$).

Next, chemical mechanical polishing is performed to the bottom intermetal dielectric layer to achieve planarization, and the bottom intermetal dielectric layer above part of the bottom metal layer 2011 and the bottom anti-reflection layer are etched to form a bottom contact hole opening, metal is filled into the bottom contact hole opening to form a bottom contact hole (CT), so as to realize the interconnection between the plurality of metal layers of the metal wiring.

In this embodiment, as shown in FIG. 2, a first metal layer 2012 is formed above the bottom intermetal dielectric layer, the forming method and the material of the first metal layer 2012 are the same as those of the bottom metal layer 2011 described, which is omitted for brevity.

Next, step S302 is performed to form a first anti-reflection layer on the first metal layer.

In this embodiment, a first anti-reflection layer is formed on the first metal layer 2012, and the forming method and the material of the first anti-reflection layer are the same as those of the bottom anti-reflection layer described above, which is omitted for brevity.

Next, step S303 is performed. As shown in FIG. 2, the first metal layer 2012 and the anti-reflection layer are performed with photolithographing and etching to define an MIM capacitor region, the first metal layer in the MIM capacitor region serves as a lower electrode plate 201 of the MIM capacitor, and the anti-reflection layer in the MIM capacitor region serves as a dielectric layer 202 of the MIM capacitor.

Exemplarily, a photoresist layer (not shown in FIG. 2) covering the first anti-reflection layer is formed, and then by using a photolithographing process, the photoresist layer is patterned to define the MIM capacitor region. The first metal layer 2012 and the first anti-reflection layer are etched with the patterned photoresist layer serving as a mask. After the etching, the first metal layer in the MIM capacitor region serves as the lower electrode plate 201 of the MIM capacitor, and the first anti-reflection layer in the MIM capacitor region serves as the dielectric layer 202 of the MIM capacitor. In other embodiments, a photoresist layer (not shown in FIG. 2) covering the first anti-reflective layer is formed, and then by using a photolithographing process, the photoresist layer is patterned to form a pattern defining the MIM capacitor region and the other circuit region at the same time. The first metal layer 2012 and the first anti-reflection layer are etched with the patterned photoresist layer serving as a mask. The first metal layer in the MIM capacitor region serves as the lower electrode plate 201 of the MIM capacitor, and the first anti-reflection layer in the MIM capacitor region serves as the dielectric layer 202 of the MIM capacitor. In the metal wiring process, the MIM capacitor region and the other circuit region are defined at the same time, so that the metal wiring process and the manufacturing of the MIM capacitor independent from each other are combined to be completed in one same step. As an example, the thickness of the lower electrode plate 201 of the MIM capacitor is in a range of 2000 angstroms to 5000 angstroms, and the thickness of the dielectric layer 202 of the MIM capacitor is in a range of 200 angstroms to 500 angstroms.

Next, step S304 is performed to form an upper electrode plate 203 of the MIM capacitor on the first anti-reflection layer in the MIM capacitor region, and the steps thereof include: form a first intermetal dielectric layer on the first anti-reflection layer, perform photolithographing and etching to the first intermetal dielectric layer to form an upper electrode plate opening in the first intermetal dielectric layer, the upper electrode plate opening exposing part of the first anti-reflection layer, namely the upper electrode plate opening exposing part of the dielectric layer 202 of the MIM capacitor, and filling metal into the upper electrode plate opening to form the upper electrode plate 203 of the MIM capacitor. In the MIM capacitor region, while forming the upper electrode plate opening in the first intermetal dielectric layer, photolithographing and etching are further performed to form at least one first contact hole opening (CT) sequentially penetrating through the first intermetal dielectric layer and the first anti-reflection layer. The first contact hole opening exposes part of the first metal layer, that is, the first contact hole opening exposes part of the lower electrode plate 201 of the MIM capacitor. The first contact hole realizes the interconnection between the plurality of metal layers of the metal wiring. The first contact hole opening is located around the upper electrode plate opening. In other embodiments, during the manufacturing process of a semiconductor device having both an MIM capacitor region and an other circuit region, while forming the upper electrode plate opening and the at least one first contact hole opening of the MIM capacitor, photolithographing and etching are further performed to the other circuit region to form at least one contact hole opening of the other circuit region, so that the metal wiring process and the manufacturing of the MIM capacitor independent from each other are combined to be completed in one same step.

Further, the upper electrode plate 203 of the MIM capacitor and the filling material of the first contact hole includes but is not limited to tungsten. The method of forming the upper electrode plate 203 of the MIM capacitor and the first contact hole may be a chemical vapor deposition (CVD) method, a physical vapor deposition (PVD) method, an atomic layer deposition (ALD) method, or the like. As an example, the area of the upper electrode plate is in a range of 10E2 um$^2$ to 10E6 um$^2$, and the thickness of the upper electrode plate of the MIM capacitor is in a range of 5000 angstroms to 8000 angstroms. In other embodiments, the upper electrode plate opening, the first contact hole opening, and the contact hole opening of the other circuit region of the MIM capacitor are filled simultaneously, and the upper electrode plate, the first contact hole, and the contact hole of the other circuit region of the MIM capacitor are formed at the same time, thus the process cycle can be further shortened.

Through the above method, the contact hole is formed by using tungsten filling while forming the upper electrode plate of the MIM capacitor by using tungsten filling, with no more need for additional photolithographing process to define the upper electrode plate region, thereby reducing the number of photolithographing processes, reducing the process cost, and shortening the process cycle.

Next, after the step of forming the upper electrode plate 203 of the MIM capacitor on the first anti-reflection layer in the MIM capacitor region, the method further includes: form a second metal layer 2013, and perform photolithographing and etching to pattern the second metal layer 2013.

In this embodiment, the forming method and the material of the second metal layer 2013, the upper electrode plate 203 of the MIM capacitor, the first contact hole, and the first intermetal dielectric layer, and the second metal the layer 2013 before photolithographing and etching are the same as those of the bottom metal layer 2011 described, which is omitted for brevity.

Next, after the step of forming a second metal layer and performing photolithographing and etching to pattern the second metal layer, the method further includes: form a second intermetal dielectric layer, and form at least one second contact hole in the second intermetal dielectric layer. Exemplarily, as shown in FIG. 2, the second contact hole 205 is electrically connected to the second metal layer 2013, and the second contact hole 205 is located above the second metal layer 2013 in the MIM capacitor region. In other embodiments, a second anti-reflection layer is further formed between the second metal layer 2013 and the second intermetal dielectric layer.

Next, a top metal layer 2014 is formed on the second intermetal dielectric layer, and photolithographing and etching are performed to pattern the top metal layer 2014. Specifically, the forming method and the material of the top metal layer 2014 are the same as those of the bottom metal layer 2011, which is omitted for brevity.

As shown in FIG. 2, the upper electrode plate 203 of the MIM capacitor and the lower electrode plate 201 of the MIM capacitor are led out to the top metal layer 2014 respectively. Specifically, the upper electrode plate 203 of the MIM capacitor is led out to the first top metal layer sequentially through the second metal layer 2013 in the MIM capacitor region and the second contact hole 205 in the MIM capacitor region. The lower electrode plate 201 of the MIM capacitor is led out to the second top metal layer sequentially through the first contact hole, the second metal layer 2013 in the MIM capacitor region, and the second contact hole in the MIM capacitor region.

According to the manufacturing method for an MIM capacitor provided by the present disclosure, during the process of the metal wiring, the MIM capacitor region and the other circuit region are defined at the same time, so that the metal wiring process and the manufacturing of the MIM capacitor independent from each other are combined to be completed in one same step; the anti-reflection layer remaining in the etched region after etching serves as the dielectric layer of the capacitor at the same time, and metal is continued to be filled into the etched region as the upper electrode plate, with no more need for manufacturing the additional dielectric layer of the capacitor, and no more need for additional photolithographing process to define the region of the upper electrode plate, which reduces the number of photolithographing and etching, thereby reducing the process cost and shortening the process cycle.

Referring to FIG. 2, the present disclosure further provides an MIM capacitor, which includes:

a semiconductor substrate, on which a first metal layer is formed;

an anti-reflection layer is formed on the first metal layer;

the semiconductor substrate includes an MIM capacitor region and an other circuit region, the first metal layer in the MIM capacitor region serves as a lower electrode plate of the MIM capacitor, and the anti-reflection layer in the MIM capacitor region serves as a dielectric layer of the MIM capacitor; and an upper electrode plate of the MIM capacitor is formed on the anti-reflection layer in the MIM capacitor region.

Exemplarily, the semiconductor substrate may be at least one of the following mentioned materials: single crystal silicon, silicon on insulator (SOI), stacked silicon on insulator (SSOI), stacked silicon germanium on insulator (S—SiGeOI), silicon germanium on insulator (SiGeOI), germanium on insulator (GeOI), and the like. An isolation structure (not shown in FIG. 2) is further formed in the semiconductor substrate. The isolation structure is a shallow trench isolation (STI) structure or a local oxidation of silicon (LOCOS) isolation structure. The isolation structure divides the substrate into different active regions, various semiconductor devices, such as NMOS and PMOS and the like, can be formed in the active regions.

Exemplarily, the metal wiring includes forming a plurality of metal layers and interconnect structures on the semiconductor substrate. As technology advances, the number of metal layers formed in the metal wiring process of the semiconductor device is gradually increased. In this embodiment, only the formation of four metal layers and interconnection structures are introduced, including a bottom metal layer 2011, a first metal layer 2012, a second metal layer 2013, and a top metal layer 2014 that are sequentially formed from bottom to top. Further, the material of the above described metal layers includes but is not limited to copper (Cu) or aluminum (Al).

In this embodiment, the semiconductor substrate includes an MIM capacitor region and an other circuit region, where the first metal layer 2012 located in the MIM capacitor region serves as the lower electrode plate 201 of the MIM capacitor. As an example, the thickness of the lower electrode plate 201 of the MIM capacitor is in a range of 2000 angstroms to 5000 angstroms.

Exemplarily, a bottom anti-reflection layer, a first anti-reflection layer, and a second anti-reflection layer are formed on the bottom metal layer 2011, the first metal layer 2012, and the second metal layer 2013, respectively. Further, the material of the above described anti-reflection layers includes silicon oxynitride (SION).

In this embodiment, a first anti-reflection layer is formed on the first metal layer 2012, and the first anti-reflection layer in the MIM capacitor region serves as the dielectric layer 202 of the MIM capacitor. As an example, the thickness of the dielectric layer of the MIM capacitor is in a range of 200 angstroms to 500 angstroms.

Exemplarily, the bottom metal layer 2011 and the first metal layer 2012 are electrically connected to each other by a bottom contact hole, the first metal layer 2012 and the second metal layer 2013 are electrically connected to each other by a first contact hole, and the second metal layer 2013 and the top metal layer 2014 are electrically connected to each other by the second contact hole, thus the interconnections between the plurality of metal layers are finally realized. Further, the material of the above described contact holes includes tungsten.

Exemplarily, an upper electrode plate 203 of the MIM capacitor is formed on the dielectric layer 202 of the MIM capacitor. Further, the material of the upper electrode plate 203 of the MIM capacitor includes tungsten. As an example, the area of the upper electrode plate is in a range of 10E2 $um^2$ to 10E6 $um^2$, and the thickness of the upper electrode plate of the MIM capacitor is in a range of 5000 angstroms to 8000 angstroms.

Exemplarily, the second metal layer 2013 is formed on the upper electrode plate 203 of the MIM capacitor. Further, the area of the lower electrode plate 201 of the MIM capacitor is equal to the area of the dielectric layer 202 of the MIM capacitor, and the area of the upper electrode plate 203 of the MIM capacitor is smaller than or equal to the area of the dielectric layer 202 of the MIM capacitor.

Exemplarily, a top metal layer 2014 is further formed on the second metal layer 2013.

Further, the upper electrode plate 203 of the MIM capacitor and the lower electrode plate 201 of the MIM capacitor are led out to the top metal layer 2014 respectively. Specifically, the upper electrode plate 203 of the MIM capacitor is led out to the first top metal layer through the second metal layer 2013 and the second contact hole 205. The lower electrode plate 201 of the MIM capacitor is led out to the second top metal layer through the first contact hole, the second metal layer 2013, and the second contact hole. The first top metal layer and the second top metal layer are separated by a third intermetal dielectric layer.

The present disclosure has been described through the above embodiments, but it should be understood that, the above embodiments are merely for the purpose of illustration and description, and are not intended to limit the present disclosure to the scope of the described embodiments. In addition, those skilled in the art can understand that, the present application is not limited to the above described embodiments, further variations and modifications can be made according to the teachings of the present disclosure, and these variations and modifications all fall within the claimed protection scope of the present disclosure. The protection scope of the present application is defined by the appended claims and equivalent scope thereof.

What is claimed is:

1. A manufacturing method for an MIM capacitor, comprising the following steps of:
    providing a semiconductor substrate, and forming a first metal layer on the semiconductor substrate;
    forming an anti-reflection layer on the first metal layer;
    performing photolithographing and etching to the first metal layer and the anti-reflection layer to define an MIM capacitor region, the first metal layer in the MIM capacitor region serving as a lower electrode plate of the MIM capacitor, and the anti-reflection layer in the MIM capacitor region serving as a dielectric layer of the MIM capacitor; and
    forming an upper electrode plate of the MIM capacitor on the anti-reflection layer in the MIM capacitor region, comprising:
        forming a first intermetal dielectric layer, and performing photolithographing and etching to form an upper electrode plate opening in the first intermetal dielectric layer, the upper electrode plate opening exposing part of the anti-reflection layer; and
        filling metal into the upper electrode plate opening to form the upper electrode plate of the MIM capacitor.

2. The manufacturing method of claim 1, wherein the step of forming the upper electrode plate opening in the first intermetal dielectric layer, the upper electrode plate opening exposing part of the anti-reflection layer further comprises:
    performing photolithographing and etching to the first intermetal dielectric layer and the anti-reflection layer outside a region of the upper electrode plate opening and in the MIM capacitor region, to form at least one first contact hole opening sequentially penetrating through the first intermetal dielectric layer and the anti-reflection layer, the first contact hole opening exposing part of the first metal layer;
    the step of filling metal into the upper electrode plate opening to form the upper electrode plate of the MIM capacitor further comprises:
    filling metal into the first contact hole opening to form a first contact hole.

3. The manufacturing method of claim 2, wherein, after the step of forming the upper electrode plate of the MIM capacitor on the anti-reflection layer in the MIM capacitor region, the method further comprises:
    forming a second metal layer, and performing photolithographing and etching to pattern the second metal layer.

4. The manufacturing method of claim 3, wherein after the step of forming the second metal layer, and performing photolithographing and etching to pattern the second metal layer, the method further comprises:
    forming a second intermetal dielectric layer, and forming at least one second contact hole in the second intermetal dielectric layer; and
    forming a top metal layer on the second intermetal dielectric layer, and performing photolithographing and etching to pattern the top metal layer.

5. The manufacturing method of claim 4, wherein the upper electrode plate of the MIM capacitor and the lower electrode plate of the MIM capacitor are led out to the top metal layer respectively.

6. The manufacturing method of claim 5, wherein the upper electrode plate of the MIM capacitor is led out to the top metal layer sequentially through the second metal layer in the MIM capacitor region and the second contact hole in the MIM capacitor region; and
    the lower electrode plate of the MIM capacitor is led out to the top metal layer sequentially through the first contact hole, the second metal layer in the MIM capacitor region, and the second contact hole in the MIM capacitor region.

7. The manufacturing method of claim 2, wherein, while performing the step of forming a first intermetal dielectric layer, and performing photolithographing and etching to form an upper electrode plate opening in the first intermetal dielectric layer, and performing the step of performing photolithographing and etching to the first intermetal dielectric layer and the anti-reflection layer outside the region of the upper electrode plate opening and in the MIM capacitor region, to form at least one first contact hole opening sequentially penetrating through the first intermetal dielectric layer and the anti-reflection layer, photolithographing and etching are further performed to an other circuit region of an semiconductor device in which the MIM capacitor is located to form at least one contact hole opening of the other circuit region.

8. The manufacturing method of claim 2, wherein a size of the upper electrode plate is larger than a size of the first contact hole.

9. The manufacturing method of claim 1, wherein a material of the dielectric layer of the MIM capacitor comprises silicon oxynitride.

10. The manufacturing method of claim 1, wherein a thickness of the dielectric layer of the MIM capacitor is in a range of 200 angstroms to 500 angstroms.

11. An MIM capacitor, comprising:
a semiconductor substrate;
a first metal layer, formed on the semiconductor substrate;
an anti-reflection layer, formed on the first metal layer; and
an upper electrode plate of the MIM capacitor, formed on the anti-reflection layer in an MIM capacitor region;
wherein, the first metal layer in the MIM capacitor region serves as a lower electrode plate of the MIM capacitor, and the anti-reflection layer in the MIM capacitor region serves as a dielectric layer of the MIM capacitor; and
wherein, an area of the anti-reflection layer is larger than an area of the upper electrode plate.

12. The MIM capacitor of claim 11, wherein an area of the upper electrode plate is in a range of 10E2 um.sup.2 to 10E6 um.sup.2.

13. The MIM capacitor of claim 11, wherein a thickness of the upper electrode plate of the MIM capacitor is in a range of 5000 angstroms to 8000 angstroms, a thickness of the lower electrode plate of the MIM capacitor is in a range of 2000 angstroms to 5000 angstroms, and a thickness of the dielectric layer of the MIM capacitor is in a range of 200 angstroms to 500 angstroms.

14. The MIM capacitor of claim 11, wherein a material of the dielectric layer of the MIM capacitor comprises silicon oxynitride.

15. The MIM capacitor of claim 11, wherein the area of the anti-reflection layer is equal to an area of the lower electrode plate.

* * * * *